(12) United States Patent
Geswender

(10) Patent No.: US 8,942,005 B2
(45) Date of Patent: Jan. 27, 2015

(54) LOW COST, HIGH STRENGTH ELECTRONICS MODULE FOR AIRBORNE OBJECT

(75) Inventor: Chris E. Geswender, Green Valley, AZ (US)

(73) Assignee: Raytheon Company, Waltham, MA (US)

( * ) Notice: Subject to any disclaimer, the term of this patent is extended or adjusted under 35 U.S.C. 154(b) by 452 days.

(21) Appl. No.: 12/470,311

(22) Filed: May 21, 2009

(65) Prior Publication Data

US 2010/0296258 A1 Nov. 25, 2010

(51) Int. Cl.
| | |
|---|---|
| H05K 1/11 | (2006.01) |
| H05K 1/14 | (2006.01) |
| H05K 7/02 | (2006.01) |
| H05K 7/04 | (2006.01) |
| H05K 7/18 | (2006.01) |
| F42B 15/08 | (2006.01) |
| F42B 30/00 | (2006.01) |

(Continued)

(52) U.S. Cl.
CPC .............. H05K 1/144 (2013.01); F42B 15/08 (2013.01); F42B 30/006 (2013.01); F42C 19/06 (2013.01); H05K 7/1434 (2013.01); H05K 2201/09027 (2013.01); H05K 2201/10378 (2013.01); H05K 2201/2018 (2013.01)
USPC ............ 361/792; 361/796; 361/803; 361/810

(58) Field of Classification Search
CPC ........ H05K 3/368; H05K 1/144; H05K 1/145
USPC ......... 361/792, 803, 815, 810, 758, 770, 785, 361/796, 797, 752, 784, 742; 439/66
See application file for complete search history.

(56) References Cited

U.S. PATENT DOCUMENTS 2,976,806 A * 3/1961 Risk et al. ...................... 361/732
3,596,140 A * 7/1971 Walsh ............................ 361/784

(Continued)

FOREIGN PATENT DOCUMENTS

| WO | 8706091 A1 | 10/1987 |
|---|---|---|
| WO | 9535589 A1 | 12/1995 |

OTHER PUBLICATIONS

Definition of "unitary" from www.thefreedictionary.com Dec. 6, 2013.*

(Continued)

*Primary Examiner* — Chau N Nguyen
*Assistant Examiner* — Roshn Varghese
(74) *Attorney, Agent, or Firm* — Thorpe North & Western LLP

(57) ABSTRACT

An electronics module is provided for utilization onboard an airborne object. In one embodiment, the electronics module includes a housing having a cavity therein, a first printed circuit board (PCB) disposed in the cavity, a second PCB disposed in the cavity above the first PCB, and a supportive interconnect structure. The supportive interconnect structure includes a substantially annular insulative body and a plurality of vias. The substantially annular insulative body extends around an inner circumferential portion of the housing between the first PCB and the second PCB to support the second PCB and to axially space the second PCB from the first PCB. The plurality of vias is formed through the substantially annular insulative body and electrically couples the first PCB to the second PCB.

21 Claims, 4 Drawing Sheets

(51) Int. Cl.
*F42C 19/06* (2006.01)
*H05K 7/14* (2006.01)

(56) References Cited

U.S. PATENT DOCUMENTS

| | | | | |
|---|---|---|---|---|
| 3,727,553 | A | | 4/1973 | Godfrey |
| 4,051,414 | A | * | 9/1977 | Will et al. .................. 361/802 |
| 4,225,900 | A | * | 9/1980 | Ciccio et al. ............... 361/739 |
| 4,520,427 | A | * | 5/1985 | Brotherton et al. ......... 361/714 |
| 4,538,211 | A | * | 8/1985 | Bertellotti et al. .......... 361/797 |
| 4,903,603 | A | * | 2/1990 | Longerich et al. ........... 102/293 |
| 5,128,831 | A | * | 7/1992 | Fox et al. ................... 361/735 |
| 5,251,099 | A | * | 10/1993 | Goss et al. .................. 361/721 |
| 5,276,590 | A | * | 1/1994 | Budman et al. ............. 361/796 |
| 5,335,144 | A | * | 8/1994 | Maroushek ................. 361/695 |
| 5,499,164 | A | * | 3/1996 | Hill-Lindsay et al. ....... 361/785 |
| 5,536,177 | A | * | 7/1996 | Casey ........................ 439/74 |
| 5,825,631 | A | * | 10/1998 | Prchal ........................ 361/790 |
| 5,841,638 | A | * | 11/1998 | Purdom et al. .............. 361/790 |
| 5,911,583 | A | * | 6/1999 | Roybal et al. ............... 439/66 |
| 6,138,951 | A | * | 10/2000 | Budris et al. ................ 102/393 |
| 6,351,383 | B1 | * | 2/2002 | Payton ....................... 361/704 |
| 6,379,191 | B1 | | 4/2002 | Goetz et al. |
| 7,215,557 | B2 | * | 5/2007 | Glovatsky et al. ........... 361/804 |
| 2007/0070608 | A1 | * | 3/2007 | Warren et al. ............... 361/735 |
| 2007/0164444 | A1 | * | 7/2007 | Sekido et al. ................ 257/777 |
| 2008/0170376 | A1 | * | 7/2008 | Sekido ........................ 361/760 |

OTHER PUBLICATIONS

European Patent Office, International Searching Authority, "International Search Report" mailed Feb. 10, 2011; International Appln. No. PCT/US2010/034383 filed May 11, 2010.

\* cited by examiner

US 8,942,005 B2

LOW COST, HIGH STRENGTH ELECTRONICS MODULE FOR AIRBORNE OBJECT

TECHNICAL FIELD

The present invention relates generally to electronics modules and, more particularly, to embodiments of a low cost, high strength electronics module for deployment onboard an airborne object, such as an airborne munition.

BACKGROUND

Airborne munitions of increasingly-smaller sizes are being equipped with electronics modules to provide precision guidance and other functionalities. When deployed aboard an airborne munition, and especially when deployed aboard a smaller airborne munition, such as a guided projectile, it is desirable for the electronics module to be relatively compact and lightweight. It is also desirable for the electronics module to operate reliably even when subjected to extreme forces resulting from, for example, projectile launch or projectile spin; e.g., an electronics module deployed within a gun-fired projectile may experience upwards of 20,000 g-forces during firing, and, during flight, may spin at a rotation rate approaching or exceeding 150 revolutions per second. Munition-deployed electronics modules commonly include a plurality of printed circuit boards (PCBs) arranged in a stacked configuration (referred to herein as the "PCB stack") to accommodate the unique geometric shape of the munition shell, which may include successive cylindrical and conical sections of varying diameters. A number of support structures, such as a tray, a slide, a cage, and the like, are typically utilized to space the PCBs apart along the longitudinal axis of the munition and to provide structural support for the PCBs in the PCB stack. Electrical interconnections are typically formed between neighboring PCBs utilizing specialized connectors, such as miniaturized connectors or flex cables.

Although relatively rugged and compact, PCB stacks of the type described above are limited in certain respects. The support structures utilized to space neighboring PCBs in conventional PCB stacks increase the overall weight and cost of the airborne munition and reduce available space within the munition shell. As a further disadvantage, the specialized connectors utilized to interconnect neighboring PCBs in the PCB stack are also relatively costly to acquire. More importantly, the installation of such specialized connectors is generally not amenable to automated manufacturing processes and consequently incurs considerable manual labor costs during low or high volume fabrication. As a still further disadvantage, specialized connectors tend to occupy an undesirably large portion of the available surface area of PCBs that have been miniaturized for deployment aboard a projectile or other airborne munition.

Accordingly, it is desirable to provide an electronics module suitable for deployment onboard an airborne munition (e.g., a projectile) or other airborne object (e.g., a satellite) that is relatively compact, rugged, reliable, and amendable to fully automated manufacturing processes. Other desirable features and characteristics of the present invention will become apparent from the subsequent Detailed Description and the appended Claims, taken in conjunction with the accompanying Drawings and this Background.

BRIEF SUMMARY

An electronics module is provided for utilization onboard an airborne object. In one embodiment, the electronics module includes a housing having a cavity therein, a first printed circuit board (PCB) disposed in the cavity, a second PCB disposed in the cavity above the first PCB, and a supportive interconnect structure. The supportive interconnect structure includes a substantially annular insulative body and a plurality of vias. The substantially annular insulative body extends around an inner circumferential portion of the housing between the first PCB and the second PCB to support the second PCB and to axially space the second PCB from the first PCB. The plurality of vias is formed through the substantially annular insulative body and electrically couples the first PCB to the second PCB.

BRIEF DESCRIPTION OF THE DRAWINGS

At least one example of the present invention will hereinafter be described in conjunction with the following figures, wherein like numerals denote like elements, and.

DETAILED DESCRIPTION

The following Detailed Description is merely exemplary in nature and is not intended to limit the invention or the application and uses of the invention. Furthermore, there is no intention to be bound by any theory presented in the preceding Background or the following Detailed Description. While terms such as upper, lower, above, and beneath appear herein, these terms are utilized for convenience only and denote, for example, the relative positions of components when the airborne object (e.g., airborne munition) carrying the electronics module is pointing upwards, it should be clear that such components will reside in other relative spatial positions when the airborne object is repositioned, such as during flight and storage.

Figure 1:
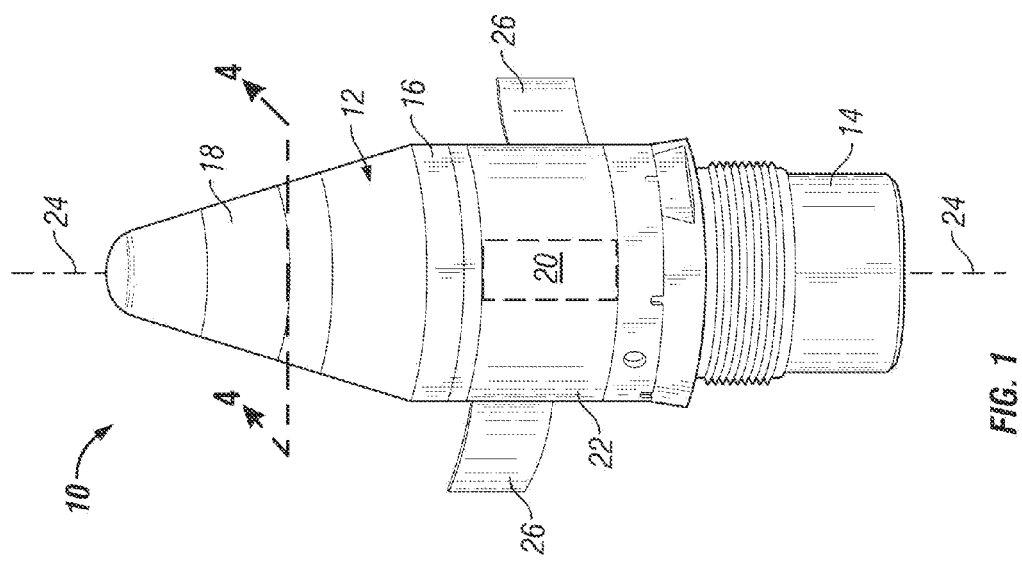
FIG. 1 is an isometric view of an exemplary airborne object, namely, a precision guidance kit adapted to threadably mount to the nose of an artillery shell.

FIG. 1 is an isometric view of an exemplary precision guidance kit ("PGK") 10. PGK 10 includes a main body 12 having a threaded aft portion 14, a cylindrical housing section 16, and a conical housing section or nose 18. A spindle 20 (shown in phantom) is fixedly disposed inside cylindrical housing section 16, and a collar 22 is rotatably disposed around spindle 20. Collar 22 is adapted to rotate relative to main body 12 about the longitudinal axis of PGK 10 (represented in FIG. 1 by dashed line 24). PGK 10 further includes a pair of canards 26, which are mounted to collar 22 and rotate along therewith. Canards 26 normally reside in a non-deployed position and are released into a deployed position (shown in FIG. 1) after firing of PGK 10. During operation of PGK 10, collar 22 and canards 26 rotate in a rotational direction opposite that of main body 12 such that the position of canards 26 is generally fixed in inertial space (commonly referred to as a "roll control fixed canard configuration") to increase guidance accuracy. Threaded aft portion 14 permits PGK 10 to be threadably mounted to the nose of an artillery shell or other projectile (not shown) in the place of a conventional fuse. In addition to providing a fusing function, PGK 10 also provides a precision guidance function during flight by manipulating the position of canards 26 in accordance with signals received from an onboard global positioning system (GPS) unit.

To provide fusing, precision guidance, and other functionalities, PGK 10 is further equipped with an electronics module including a plurality of printed circuit boards (PCBs) disposed in a stacked configuration. In contrast to conventional PCB stacks wherein neighboring PCBs are electrically connected utilizing flex cables or other specialized connectors, embodiments of the electronics module further include one or more supportive interconnect structures, which electrically couple and axially space neighboring PCBs along the longitudinal axis of PGK 10. The supportive interconnect structures described herein also provide robust structural support of the PCBs in the PCB stack thus eliminating the need for trays, slides, cages, and other such structural systems typically utilized in conventional munition-deployed electronics modules.

Figure 2:
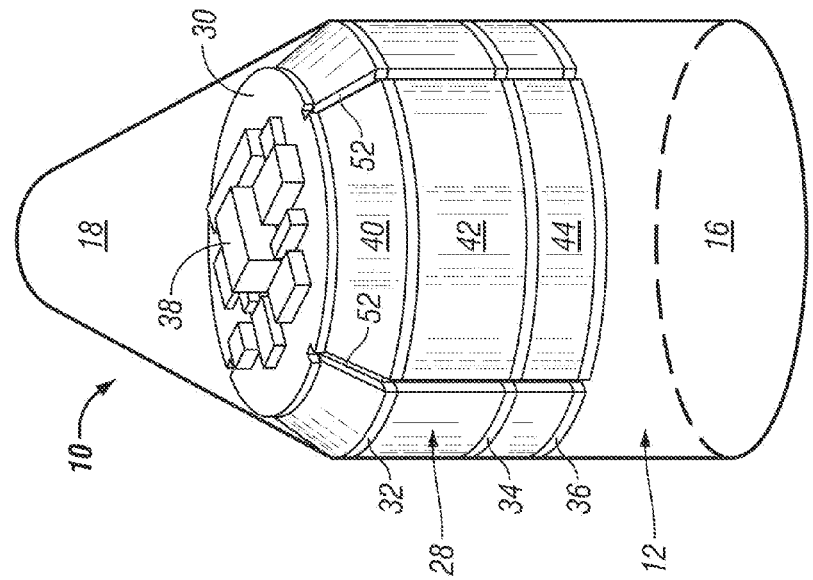
FIGS. 2 and 3 are isometric and exploded views, respectively, of an electronics module deployed within the precision guidance kit shown in FIG. 1 in accordance with a first exemplary embodiment.
Figure 3:
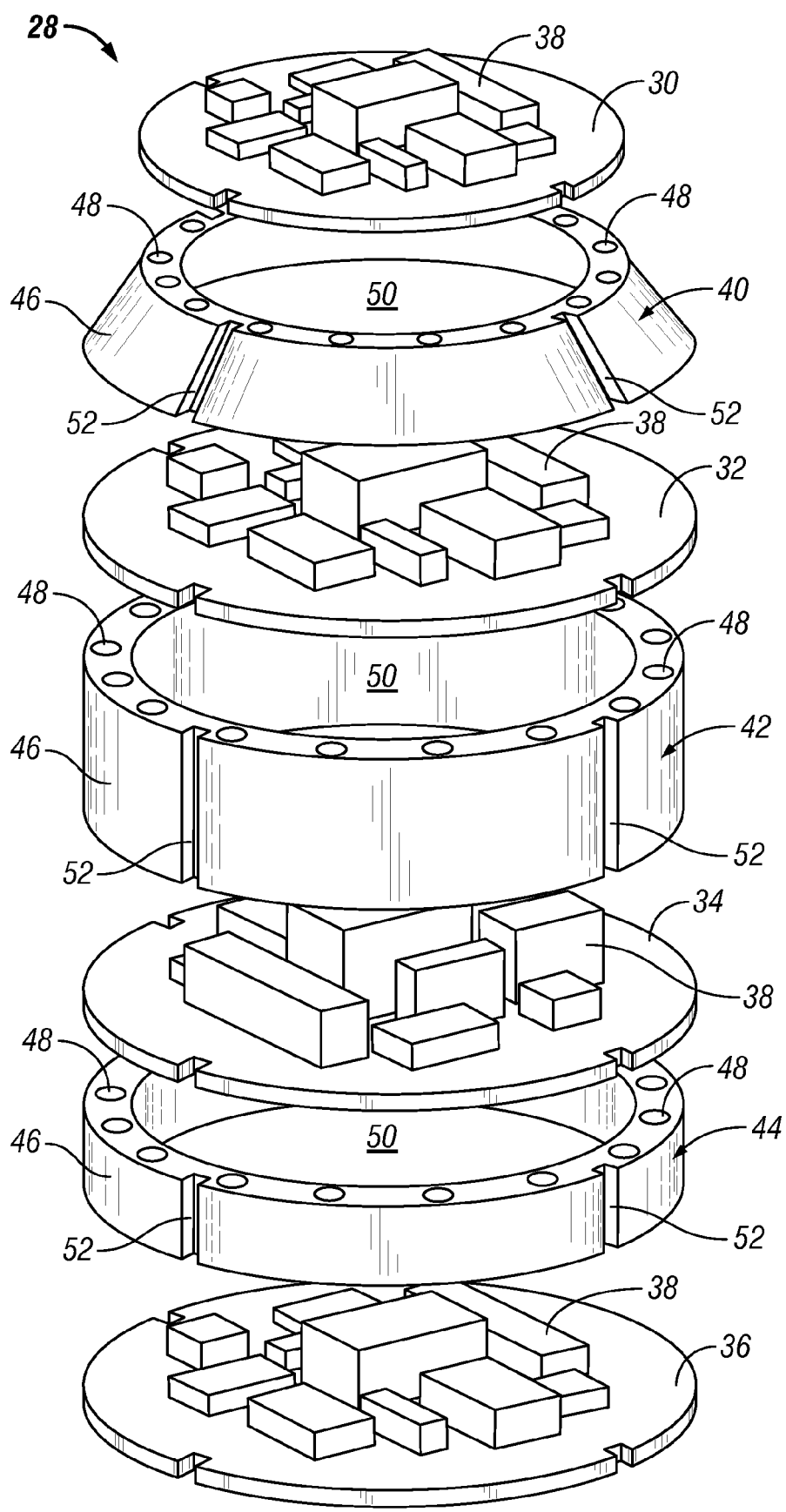

FIG. 2 is an isometric view of an electronics module 28 mounted within a cavity provided within cylindrical housing section 16 and conical housing section 18 of main body 12 (illustrated in phantom) in accordance with a first exemplary embodiment; and FIG. 3 is an exploded view of electronics module 28. In the illustrated example, electronics module 28 includes four printed circuit boards 30, 32, 34, and 36. Circuit board 30, 32, 34, and 36 each have a generally circular planform shape and are populated with a number of surface-mounted electronic devices 38. Electronics module 28 further includes a three supportive interconnect structures 40, 42, and 44, which are axially interspersed with PCBs 30, 32, 34, and 36. More specifically, supportive interconnect structure 40 is disposed between a lower surface of PCB 30 and an upper surface of PCB 32, supportive interconnect structure 42 is disposed between a lower surface of PCB 32 and an upper surface of PCB 34, and supportive interconnect structure 44 is disposed between a lower surface of PCB 34 and an upper surface of PCB 36. In a preferred group of embodiments, supportive interconnect structures 40, 42, and 44 mate directly with PCBs 30, 32, 34, and 36 as described more fully below.

As identified in FIG. 3, supportive interconnect structures 40, 42, and 44 each include a substantially annular insulative body 46 and a plurality of vias 48. Each substantially annular insulative body 46 includes a central opening 50 therethrough (FIG. 3), which accommodates electronic devices 38 when electronics module 28 is assembled (shown in FIG. 2). That is, central openings 50 provided through insulative bodies 46 of supportive interconnect structures 40, 42, and 44 accommodate electronic devices 38 residing on PCBs 32, 34, and 36, respectively. To maximize usable space, the axial height of each supportive interconnect structure 44 is preferably slightly greater than the height of the electronic devices 38 populating the PCB below the supportive interconnect structure 44. For example, and with reference to FIG. 3, it can be seen that the axial height of supportive interconnect structure 42, and specifically the axial height of insulative body 46 of supportive interconnect structure 42, is greater than the axial height of supportive interconnect structures 40 and 42. As a result of this increased axial height, supportive interconnect structure 42 is able to accommodate the electronic devices 38 mounted on the upper surface of PCB 34, which have a greater axial height than do the electronic devices 38 mounted on PCBs 32 and 36. Substantially annular insulative bodies 46 may each be formed (e.g., molded) from a variety of insulative materials including various synthetic resins, ceramics, and plastics, such as Bakelite®.

As indicated in FIG. 2, substantially annular insulative bodies 46 are co-axially disposed within main body 12 and extend around an inner circumference of the cavity provided within main body 12. More specifically, substantially annular insulative bodies 46 of supportive interconnect structure 42 and 44 extend around an inner circumferential portion of cylindrical housing section 16, and substantially annular insulative body 46 of supportive interconnect structure 40 extends around an inner circumferential portion of conical housing section 18. Substantially annular insulative bodies 46 of supportive interconnect structures 42 and 44 each have a generally cylindrical shape that conforms with the cavity provided within cylindrical housing section 16. By comparison, substantially annular insulative body 46 of supportive interconnect structure 40 has a generally conical shape that conforms with the cavity provided within conical housing section 18. Stated differently, supportive interconnect structure 40 tapers radially inward from a lower portion of structure 40, which has a larger outer diameter that is substantially equivalent to the outer diameter of PCB 32, to an upper portion of structure 40, which has a smaller outer diameter that is substantially equivalent to the outer diameter of PCB 30. This example notwithstanding, the substantially annular insulative bodies and the printed circuit boards included within alternative embodiments of the electronics module may assume various other geometries, including polygonal geometries, to conform with the unique geometry or shape of the particular cavity in which the electronics module is deployed.

In the exemplary embodiment illustrated in FIGS. 1-3, substantially annular insulative body 46 of supportive interconnect structure 40 contacts and extends around: (i) an outer peripheral portion of the lower surface of PCB 30, and (ii) an outer peripheral portion of the upper surface of PCB 32. Similarly, substantially annular insulative body 46 of supportive interconnect structure 42 contacts and extends around: (i) an outer peripheral portion of the lower surface of PCB 32, and (ii) an outer peripheral portion of the upper surface of PCB 34. Finally, substantially annular insulative body 46 of supportive interconnect structure 44 contacts and extends around: (i) an outer peripheral portion of the lower surface of PCB 34, and (ii) an outer peripheral portion of the upper surface of PCB 36. As a result of this configuration, substantially annular insulative bodies 46 provide robust structural support to PCBs 30, 32, and 34, which may experience significant mechanical stressors due to projectile launch and spin. Supportive interconnect structures 40, 42, and 44, and specifically substantially annular insulative bodies 46 of structures 40, 42, and 44, also serve to space PCBs 30, 32, 34, and 36 apart, as taken along the longitudinal axis of main body 12 (represented in FIG. 1 by dashed line 24). Supportive interconnect structures 40, 42, and 44 thus eliminate the need for complex, bulky, and costly structural support systems (e.g., trays, slides, cages, etc.) commonly utilized to support and space PCBs in conventional munition-deployed electronics modules. To further decrease the likelihood of the inner portion of PCBs 30, 32, and 34 becoming excessively concave during launch and flight (an occurrence commonly referred to as "oil canning"), the interior of each substantially annular insulative body 46 may be potted utilizing a non-conductive material, such as a resin plastic or epoxy.

Vias 48 extend axially through substantially annular insulative bodies 46 to electrically couple neighboring PCBs in electronics module 28. In particular, vias 48 of supportive interconnect structure 40 extend from an upper surface of the corresponding substantially annular insulative body 46 to a lower surface thereof to electrically couple PCB 30 to PCB 32, vias 48 of supportive interconnect structure 42 extend from an upper surface of the corresponding substantially annular insulative body 46 to a lower surface thereof to electrically couple PCB 32 to PCB 34, and vias 48 of supportive interconnect structure 44 extend from an upper surface of the corresponding substantially annular insulative body 46 to a lower surface thereof to electrically couple PCB 34 to PCB 36. Vias 48 are preferably circumferentially spaced or radially dispersed around the longitudinal axis of each substantially annular insulative body 46. Electrical connections between vias 48 and corresponding contacts provided on PCBs 30, 32, 34, and 36 are preferably formed utilizing an electrical interface or joining technique that is amenable to automation, such as a conductive hook-and-loop type interface, a pressure welding technique, or a flow solder technique.

Figure 4:
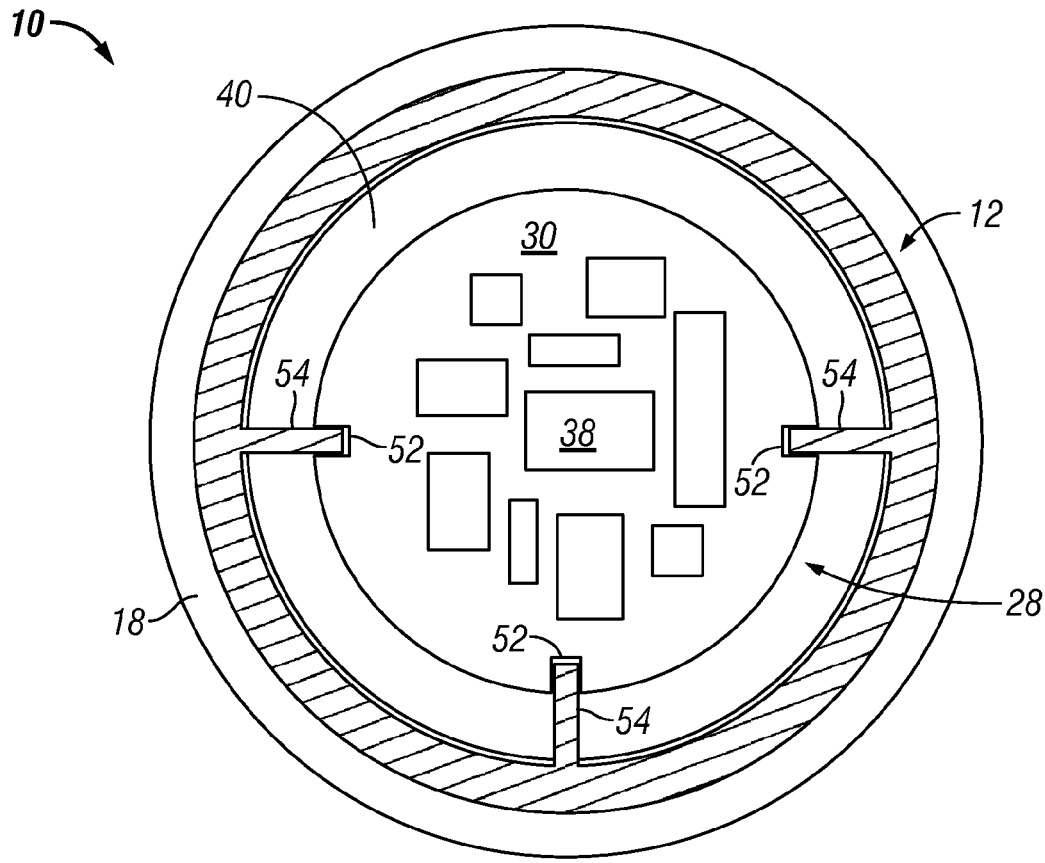
FIG. 4 is a cross-sectional view of the precision guidance kit shown in FIG. 1 and the electronics module shown in FIGS. 2 and 3 taken along line 4-4 identified in FIG. 1.

Advantageously, and in contrast to conventional munition-deployed electronics modules in which neighboring printed wiring boards are electrically connected utilizing specialized flex cables or miniaturized connectors, embodiments of the electronics module disclosed herein are amenable to fully automated manufacturing processes. To facilitate automation of manufacture, the supportive interconnect structures and the printed circuit boards are preferably provided with clocking or rotational orientation features. For example, and with reference to the exemplary embodiment illustrated in FIGS. 2 and 3, three notches may be formed through an outer circumferential portion of PCBs 30, 32, 34, and 36 and supportive interconnect structures 40, 42, and 44 at predetermined angular positions. When electronics module 28 is assembled (FIG. 2), the notches align along the longitudinal axis of electronic module 28 to define three longitudinal keyways 52. As shown in FIG. 4, which is a cross-sectional view of PGK 10 and electronics module 28 taken along line 4-4 in FIG. 1, each longitudinal keyway 52 receives a corresponding longitudinal key 54 projecting radially inward from main body 12 when PGK 10 is assembled. In this manner, longitudinal keyways 52 and keys 54 cooperate to ensure that PCBs 30, 32, 34, and 36 and supportive interconnect structures 40, 42, and 44 are in their appropriate rotational positions ("clockings") and thus facilitate automated positioning by a pick-and-place robot or similar machine. Longitudinal keyways 52 and keys 54 may also provide additional structural support of electronics module 28.

Figure 5:
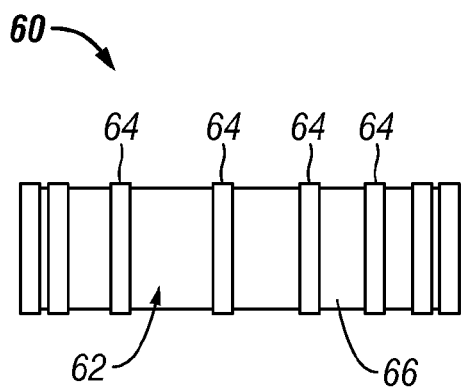
FIGS. 5 and 6 are side isometric and cross-sectional views, respectively, of a supportive interconnect structure including a substantially annular insulative body and a plurality of axial vias formed through an outer peripheral surface of the insulative body in accordance with a second exemplary embodiment.
Figure 6:
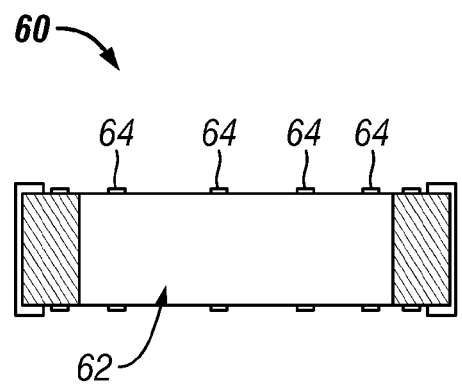
Figure 7:
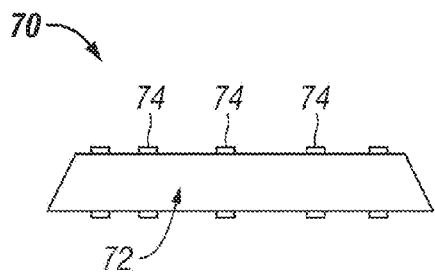
FIGS. 7 and 8 are side isometric and cross-sectional views, respectively, of a supportive interconnect structure including a substantially annular insulative body and a plurality of axial vias formed through an inner peripheral surface of the insulative body in accordance with a third exemplary embodiment.
Figure 8:
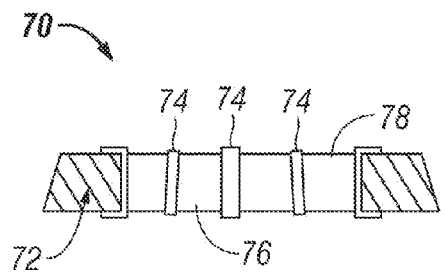

The foregoing has thus provided an exemplary embodiment of an electronics module including multiple supportive interconnect structures axially interspersed with a stack of printed circuit boards. Each supportive interconnect structure included a substantially annular insulative body and a plurality of vias, which extended axially through the insulative body to electrically couple neighboring PCBs in the PCB stack. In the above-described example, the vias where provided through a medial annular portion of the substantially annular insulative body and were not exposed through either the outer circumferential sidewall or the inner circumferential sidewall of the insulative body; however, this may not always be the case. FIGS. 5 and 6 are isometric and cross-sectional views, respectively, of a supportive interconnect structure 60 in accordance with a second exemplary embodiment. As was the case previously, supportive interconnect structure 60 includes a substantially annular insulative body 62 having a plurality of vias 64 extending axially therethrough. However, in this particular example, vias 64 are formed through an outer annular portion of insulative body 62 and extend radially outward therefrom. Thus, as generally shown in FIGS. 5 and 6, axial vias 64 are exposed through outer circumferential sidewall 66 of insulative body 62. As a further example, FIGS. 7 and 8 are isometric and cross-sectional views, respectively, of a supportive interconnect structure 70 in accordance with a third exemplary embodiment. Supportive interconnect structure 70 includes a substantially annular insulative body 72 having a plurality of axial vias 74 formed therethrough. In this case, axial vias 74 are formed through an inner annular portion of substantially annular insulative body 72 and extend radially into a central opening 76 provided through insulative body 72. Axial vias 64 are thus exposed through an inner circumferential sidewall 78 of insulative body 72.

Figure 9:
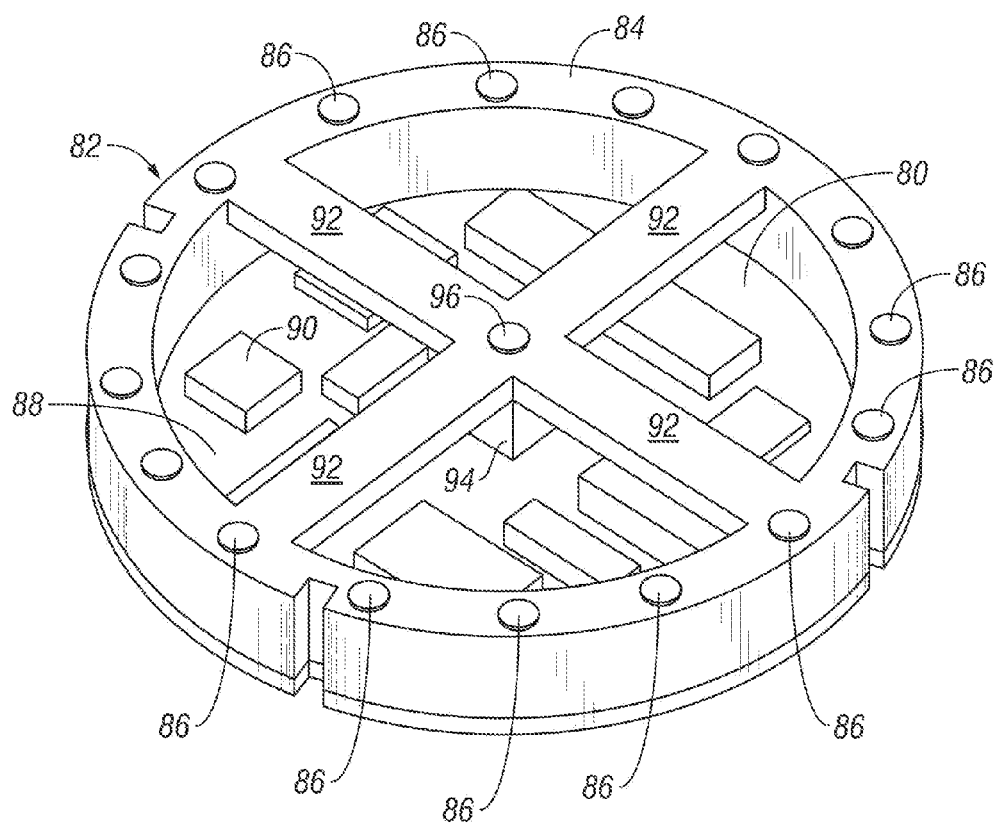
FIG. 9 is an isometric view of a printed circuit board and a supportive interconnect structure having a central post and a plurality of radial spokes in accordance with a fourth exemplary embodiment.

In further embodiments of the electronics module, the supportive interconnect structures may include one or more structural features that extend radially inward from the insulative body to provide additional support to the printed circuit board residing above the interconnect structure. Such structural features may include a web-like lattice, a solid disc having depressions therein to accommodate the component skyline of the PCB residing below the interconnect structure, one or more radial spokes, one or more axial posts, and the like. Further emphasizing this point, FIG. 9 is an isometric view of a printed circuit board (PCB) 80 and a supportive interconnect structure 82 in accordance with a fourth exemplary embodiment. In many respects, supportive interconnect structure 82 is similar to the supportive interconnect structures of electronics module 28 described above in conjunction with FIGS. 1-4. For example, supportive interconnect structure 82 includes a substantially annular insulative body 84 and a plurality of vias 86, which extends axially through insulative body 84 to electrically couple PCB 80 to a second printed circuit board residing above supportive interconnect structure 82 (not shown). As was the case previously, a central opening 88 is provided through substantially annular insulative body 84 to accommodate a number of electronic devices 90 populating the upper surface of PCB 80. However, in contrast to the supportive interconnect structures of above-described electronics module 28 (FIGS. 1-4), supportive interconnect structure 82 further includes a plurality of radial spokes 92 and a central axial post 94. Radial spokes 92 extend radially inward from substantially annular insulative body 84 into central opening 88 to meet central axial post 94. Central axial post 94 extends downward from spokes 92 to contact the upper surface of PCB 80. In this manner, central axial post 94 and radial spokes 92 cooperate to provide additional structural support to the non-illustrated printed circuit board residing above supportive interconnect structure 82; e.g., central axial post 94, and to a lesser extent radial spokes 92, further help to prevent the inner portion of the upper printed circuit board (not shown) from becoming excessively concave during projectile launch and flight. In addition, and as indicated in FIG. 9 at 96, one or more axial vias may be provided through central axial post 94 to provide additional contact points between neighboring PCBs.

There has thus been provided at least one exemplary embodiment of an electronics module suitable that is relatively compact, rugged, reliable, and amendable to fully automated manufacturing processes. Although the foregoing described the exemplary electronics module in the context of a particular type of component (i.e., a precision guidance kit) adapted to be threadably mounted to an artillery shell or other projectile, it is emphasized that embodiments of the electronics module are also useful for deployment within a wide variety of airborne objects, including other types of airborne munition (e.g., missiles and unmanned air vehicles), airborne sub-munitions, modular components adapted to be mounted to airborne munitions (e.g., fuse kits), satellites, land or water based robotic vehicles, and certain aircraft. It is noted, however, that embodiments of the electronics module are compact and capable of withstanding significant mechanical stressors and are consequently especially well-suited for utilization aboard smaller sized airborne munitions, such as artillery shells and other projectiles.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended Claims.

What is claimed is:

1. An electronics module for utilization onboard an airborne object, the electronics module comprising:
    a housing having a cavity therein;
    a first printed circuit board (PCB) disposed in the cavity, and supporting a first plurality of electronic devices having a first maximum height;
    a second PCB disposed in the cavity above the first PCB, and supporting a second plurality of electronic devices having a second maximum height different from the first maximum height;
    a third PCB disposed in the cavity above the second PCB;
    a first supportive interconnect structure, comprising:
        a first substantially annular insulative body extending around an inner circumferential portion of the housing between the first PCB and the second PCB to support the second PCB, wherein the first substantially annular insulative body comprises a single unitary body having a substantially continuous annular sidewall to provide robust structural support to the electronics module, the first substantially annular insulative body being configured to axially space the second PCB from the first PCB; and
        a first plurality of vias formed through the first substantially annular insulative body and electrically coupling the first PCB to the second PCB; and
    a second supportive interconnect structure, comprising:
        a second substantially annular insulative body extending around an inner circumferential portion of the housing between the second PCB and the third PCB to support the third PCB, wherein the second substantially annular insulative body comprises a single unitary body configured to axially space the third PCB from the second PCB; and
        a second plurality of vias formed through the second substantially annular insulative body and electrically coupling the second PCB to the third PCB,
        wherein a first axial height of the first substantially annular insulative body is minimized to accommodate the first maximum height of the first plurality of electronic devices, and a second axial height of the second substantially annular insulative body is minimized to accommodate the second maximum height of the second plurality of electronic devices, the first axial height of the first substantially annular insulative body being different from the second axial height of the second substantially annular insulative body, such that a usable space within the housing is maximized.

2. An electronics module according to claim 1 wherein the first substantially annular insulative body contacts and extends around an outer peripheral portion of the upper surface of the first PCB.

3. An electronics module according to claim 2 wherein the first substantially annular insulative body contacts and extends around an outer peripheral portion of the lower surface of the second PCB.

4. An electronics module according to claim 3 wherein the first supportive interconnect structure mates directly with the first PCB and with the second PCB.

5. An electronics module according to claim 1 wherein the first plurality of vias are radially spaced about the longitudinal axis of the first substantially annular insulative body.

6. An electronics module according to claim 1 wherein the first PCB and the second PCB each have a substantially circular shape that is generally conformal with the cavity.

7. An electronics module according to claim 6 wherein the first supportive interconnect structure has a substantially cylindrical shape that is generally conformal with the cavity.

8. An electronics module according to claim 6 wherein the outer diameter of the third PCB is less than the outer diameter of the second PCB, and wherein the second supportive interconnect structure tapers radially inward from a lower portion of the second supportive interconnect structure to an upper portion of the second supportive interconnect structure.

9. An electronics module according to claim 8 wherein the lower portion of the second supportive interconnect structure has an outer diameter substantially equivalent to that of the second PCB, and wherein the upper portion of the second supportive interconnect structure has an outer diameter substantially equivalent to that of the third PCB.

10. An electronics module according to claim 1 wherein the first substantially annular insulative body comprises an inner circumferential sidewall through which the first plurality of vias is exposed.

11. An electronics module according to claim 1 wherein the first substantially annular insulative body comprises an outer circumferential sidewall through which the first plurality of vias is exposed.

12. An electronics module according to claim 1, further comprising a rotational orientation feature comprising:
    a longitudinal key projecting radially inward from an inner surface of the housing; and
    a longitudinal keyway formed through at least one of the first PCB, the second PCB, and the supportive interconnect structure, the longitudinal keyway receiving the longitudinal key therein.

13. An electronics module according to claim 12 wherein the longitudinal keyway is formed through each of the first PCB, the second PCB, and the first substantially annular insulative body.

14. An electronics module according to claim 1 wherein the airborne object comprises an airborne projectile, and wherein an aft portion of the housing is threaded to permit the housing to be threadably mounted to the airborne projectile.

15. An electronics module according to claim 1 further comprising at least one via formed through a central axial post and electrically coupling the first and second PCBs, the central axial post extending from the first PCB to the second PCB to support a central portion of the second PCB.

16. An electronics module according to claim 1, further comprising:
 a central opening formed through the first substantially annular insulative body and accommodating the first plurality of electronic devices; and
 a central axial post coupled to the first substantially annular insulative body and extending within the central opening from the first PCB to the second PCB to support a central portion of the second PCB.

17. An electronics module according to claim 16 wherein the first supportive interconnect structure further comprises a radial spoke projecting radially from the first substantially annular insulative body into the central opening to connect with the central axial post and further support the second PCB.

18. An electronics module for utilization onboard an airborne object, the electronics module comprising:
 a housing having a cavity therein;
 a plurality of printed circuit boards (PCBs) disposed in the cavity in a stacked configuration, at least two of the PCBs supporting pluralities of electronic devices having different maximum heights; and
 a plurality of supportive interconnect structures axially interspersed with the plurality of the PCBs, each supportive interconnect structure in the plurality of supportive interconnect structures comprising:
  a substantially annular insulative body disposed within the housing and generally conformal with the cavity, the substantially annular insulative body extending between neighboring PCBs in the plurality of PCBs to provide structural support, wherein the substantially annular insulative body comprises a single unitary body having a substantially continuous annular sidewall to provide robust structural support to the electronics module, the insulative body being configured to provide axial spacing; and
  a plurality of vias extending axially through the substantially annular insulative body to electrically couple neighboring PCBs in the plurality of PCBs,
 wherein an axial height of the substantially annular insulative body of each of the plurality of supportive interconnect structures is minimized to accommodate the different maximum heights of the pluralities of electronic devices, an axial height of a first substantially annular insulative body being different from an axial height of a second substantially annular insulative body, such that a usable space within the housing is maximized.

19. An electronics module according to claim 18 wherein the plurality of supportive interconnect structures are substantially co-axial.

20. An electronics module according to claim 18, further comprising:
 a plurality of notches formed in the plurality of PCBs and the substantially annular insulative bodies, the plurality of notches aligning axially to produce at least one longitudinal keyway; and
 at least one longitudinal key projecting radially inward from an inner surface of the housing and into the at least one longitudinal keyway.

21. A method for producing an electronics module for an airborne object, the method comprising: providing a housing having a cavity therein; disposing first, second, and third printed circuit boards (PCBs) in the cavity, the first PCB supporting a first plurality of electronic devices having a first maximum height, the second PCB supporting a second plurality of electronic devices having a second maximum height different from the first maximum height; electrically coupling the first and second PCBs utilizing a first supportive interconnect structure disposed between the first and second PCBs, the first supportive interconnect structure comprising: a first substantially annular insulative body extending around an inner circumferential portion of the housing between the first PCB and the second PCB to support the second PCB and to axially space the second PCB from the first PCB, wherein the first substantially annular insulative body comprises a single unitary body having a substantially continuous annular sidewall to provide robust structural support to the electronics module; and a first plurality of vias formed through the first substantially annular insulative body and electrically coupling the first PCB to the second PCB; and electrically coupling the second and third PCBs utilizing a second supportive interconnect structure disposed between the second and third PCBs, the second supportive interconnect structure comprising: a second substantially annular insulative body extending around an inner circumferential portion of the housing between the second PCB and the third PCB to support the third PCB and to axially space the third PCB from the second PCB, wherein the second substantially annular insulative body comprises a single unitary body having a substantially continuous annular sidewall; and a second plurality of vias formed through the second substantially annular insulative body and electrically coupling the second PCB to the third PCB, wherein a first axial height of the first substantially annular insulative body is minimized to accommodate the first a maximum height of the first plurality of electronic devices, and a second axial height of the second substantially annular insulative body is minimized to accommodate the second maximum height of the second plurality of electronic devices, the first axial height of the first substantially annular insulative body being different from the second axial height of the second substantially annular insulative body, such that a usable space within the housing is maximized.

* * * * *